(12) United States Patent
Welch et al.

(10) Patent No.: US 6,614,260 B1
(45) Date of Patent: Sep. 2, 2003

(54) SYSTEM AND METHOD FOR DYNAMIC MODIFICATION OF INTEGRATED CIRCUIT FUNCTIONALITY

(75) Inventors: M. Jason Welch, Ft. Collins, CO (US); Paul D Nuber, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 444 days.

(21) Appl. No.: 09/627,696

(22) Filed: Jul. 28, 2000

(51) Int. Cl.[7] ............................................. H03K 19/177
(52) U.S. Cl. ............................. 326/41; 326/10; 326/38
(58) Field of Search ............................ 326/9, 10, 37–41

(56) References Cited

U.S. PATENT DOCUMENTS 5,485,102 A * 1/1996 Cliff et al. .................... 326/10
5,677,884 A * 10/1997 Zagar et al. ................ 365/200
6,091,258 A * 7/2000 McClintock et al. ......... 326/10

* cited by examiner

Primary Examiner—Don Le
(74) Attorney, Agent, or Firm—Kyle J. Way

(57) ABSTRACT

Programmable circuit blocks and programmable interconnection blocks are utilized to effectively modify the functionality of a section of the IC. The use of a fixed ion beam machine or similar device is unnecessary, allowing functional modifications of the IC by way of electrically programming the device. As a result, the IC designer is not limited in the number of ICs that may be modified, which facilitates faster testing of IC design changes. Also, an IC may be modified multiple times by simply reprogramming the device.

27 Claims, 6 Drawing Sheets

SYSTEM AND METHOD FOR DYNAMIC MODIFICATION OF INTEGRATED CIRCUIT FUNCTIONALITY

BACKGROUND OF THE INVENTION

Although many advancements have been made in the area of semi-custom IC (integrated circuit) design and simulation technology, design errors, or "bugs," are still, and probably always will be, a major concern for the IC designer. Several reasons exist for this situation. For one, although the speed and capability of simulation technology have improved greatly over the years, it is still not possible to provide 100 percent test coverage over all functions provided by an IC prior to chip fabrication, given the usual pressure to deliver the chip as soon as possible. No matter how fast a functional simulation can be performed, it can never rival the speed at which the actual IC will operate. Compounding the problem is the fact that ICs become faster and denser with each passing product generation, making the task of simulating the device even more difficult. The result of these particular circumstances is that a full-fledged functional test of the chip generally does not occur until the IC has been manufactured, at which time the tests are performed on an actual IC in real-time, thereby increasing both testing speed and coverage. It is at this point that many hard-to-find functional design errors are found. Unfortunately, with an error discovered at such a late date, the time-to-market of the IC is ordinarily negatively impacted since many functional errors require a new release of the chip.

Bugs are not the only instigators of unplanned design changes. For example, the functional specification for the chip may change after the device has been released to manufacturing. Such a change in the IC specification may be the result of a design change in the circuitry that is to communicate with the IC, thus necessitating a cooperating change in the IC. In other instances, the ultimate customer of the IC may request design changes based on new functional requirements. Therefore, it can be seen that several factors exist which may prompt IC design changes after the IC has already been released for fabrication.

In the past, the increase in time-to-market due to a functional design change in the IC has been mitigated somewhat by the placement of unused logic gates among the functional logic of the device. These extra gates can be connected to update the circuit in question by way of a "metal mask change," whereby only the metal (connection) layers of the IC are modified. Generally speaking, changes involving only the metals layers are easier than those involving the silicon, thus slightly reducing the time involved with generating another release of the IC.

The value of metal-mask-only changes is evident, provided the associated design change has been proven. To actually prove the viability of the change in hardware prior to committing to another release of the IC for manufacture, however, has required other solutions. For example, many functional changes are implemented and verified by the use of a FIB (Fixed Ion Beam) machine. In general, a FIB is machine is capable of cutting and depositing metal on an existing IC to change the connections between circuit elements to implement the desired change. Although use of the FIB machine allows the correctness of a modification to be definitively proven, the unit is rather slow and tedious to use. As a result, the FIB process is not easily scalable to be used on multiple devices to expedite testing, nor is it practical to use the process multiple times on one device, which may be desirable in the case that a bug fix uncovers a more subtle functional error. Furthermore, many connection wires, such as those involving only the inner metal layers of the IC, cannot be operated on by the FIB machine due to their inaccessibility, with those wires often being covered by the connections that are implemented in the outer metal layers.

Therefore, a need currently exists in the integrated circuit industry for a quick and efficient way of implementing and verifying design modifications in IC devices. Additionally, it would be even more beneficial if it were possible to implement functional changes in multiple ICs rapidly, thereby allowing large quantities of ICs to be modified and tested concurrently. Such a method would also potentially eliminate the need to re-release the device in instances where only a limited number of ICs are to be produced initially.

SUMMARY OF THE INVENTION

Specific embodiments of the invention, to be presented below, provide a way for an IC designer to dynamically modify selected functions of an integrated circuit after fabrication. Physical alteration of the metal layers of the device is not employed. Furthermore, modifications of the functionality of the selected sections of the device can be performed on as many of the devices as is desired, and each IC may be updated multiple times with different modifications.

According to an embodiment of the invention, a block of programmable circuitry is coupled with the input and output signal lines of an original section of circuitry within the IC during the design phase. In this embodiment, the coupling of the output lines takes the form of one or more programmable interconnection blocks, so that either the original section of circuitry or the programmable circuit blocks may be connected with the output signal lines. Likewise, the input signal lines may be coupled to the programmable circuit blocks by way of programmable interconnection blocks, as well. Alternately, the input signals may be directly connected to the programmable interconnection blocks. Once it has been determined after IC fabrication that the original circuit section must be modified, the programmable circuit blocks and the programmable interconnection blocks may be configured dynamically, either within a dedicated IC test system, or the target system for which the IC was designed, thereby replacing the functionality of the original circuit section with that programmed into the programmable circuit blocks.

Alternately, a method according to an embodiment of the invention begins with coupling one or more programmable circuit blocks with the input signal lines of a section of circuitry that may be updated in the future. According to this method embodiment, the programmable circuit blocks are then coupled with one or more programmable interconnection blocks, which themselves couple the original circuit section with the output signal lines. Once the chip has been fabricated, the programmable circuit blocks are programmed to provide a new function to replace the functionality of the circuit section to be modified, and the programmable interconnection blocks are configured to connect the programmable circuit block to the output signal lines, which also has the effect of decoupling the problematic circuit section from the output signal lines.

Since the systems and methods of the present invention involve placing the appropriate programmable circuitry to allow future circuit changes, and the changes themselves merely involve programming the device electrically, no practical limit exists as to the number of times that a single IC may be updated, nor as to how many ICs are modified.

Other aspects and advantages of the invention will become apparent from the following detailed description, taken in conjunction with the accompanying drawings, illustrating by way of example the principles of the invention.

DETAILED DESCRIPTION

Figure 1:
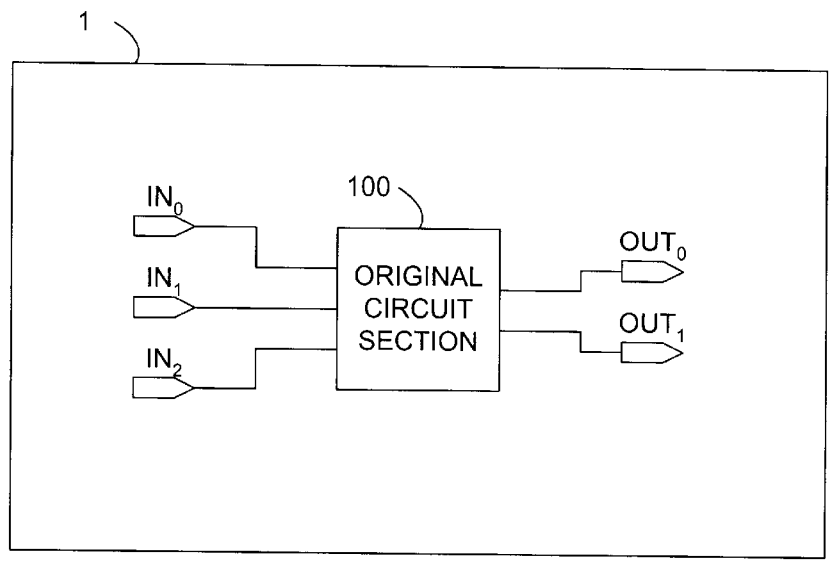
FIG. 1 is a block diagram of an example of an original circuit section of an integrated circuit.

To provide a basis for the embodiments of the invention to be described in detail below, an original circuit section 100 within an IC device 1 is presented in FIG. 1. Original circuit section 100 is driven functionally by three input signal lines $IN_0$, $IN_1$, and $IN_2$, and drives output signal lines $OUT_0$ and $OUT_1$. (The number of input and output signals devised for this specific example is arbitrary; any circuit section within IC 1 will have a number of input and output signal lines that are appropriate for the particular function being performed.) If original circuit section 100 is particularly complex in its design, or if it performs a particularly critical function within IC 1, it may present a unique exposure to errors and, therefore, future design changes, when compared to other portions of circuitry within IC 1. Original circuit section 100, and others of a similar nature within IC 1, would thus be selected as target circuits for embodiments of the present invention. This selection process may be performed in an "ad hoc" fashion by an IC designer that is familiar with IC 1. More specifically, intimate knowledge of IC 1 may be used by the designer to determine which circuit sections would be the most likely to benefit from protection against having to use a FIB machine to verify a proposed design change, and then re-release a new version of the IC for fabrication. Alternately, the portions of circuitry within IC 1 to be augmented by particular embodiments of the invention may be chosen automatically via a software algorithm that evaluates the complexity and functionality of the various circuit sections within IC 1.

Figure 2:
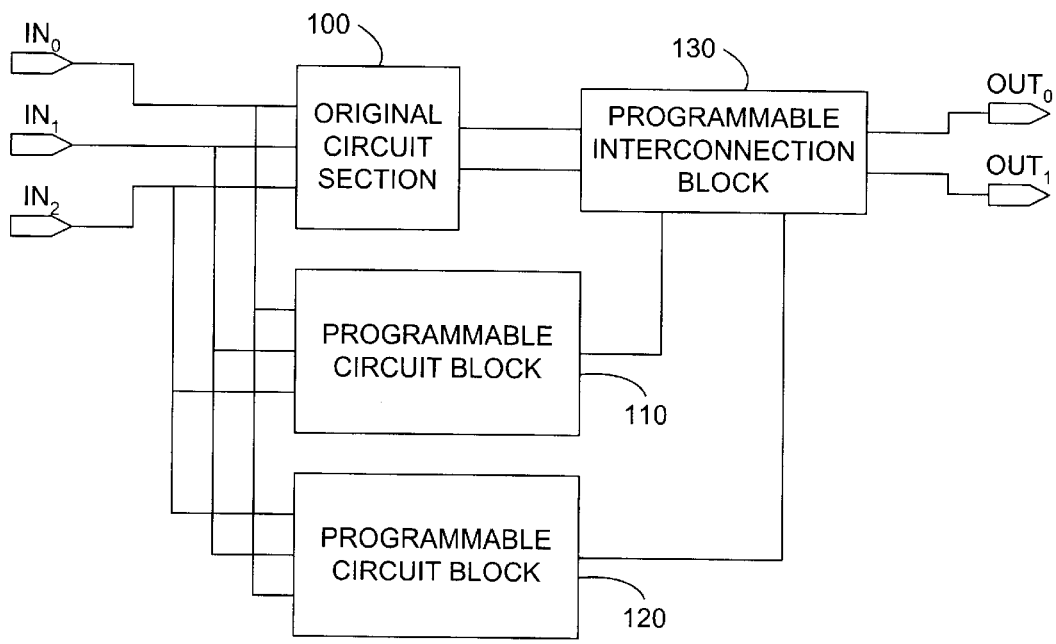
FIG. 2 is a block diagram of an embodiment of the invention that directly connects programmable circuit blocks to input signal lines associated with the original circuit section.

One embodiment of the invention is displayed in FIG. 2. In this particular example, a first programmable circuit block 110 and a second programmable circuit block 120 are connected directly to input signal lines $IN_0$, $IN_1$, and $IN_2$ associate with original circuit section 100. First and second programmable circuit blocks 110 and 120 are also coupled with a first programmable interconnection block 130, which also couples the output signal lines $OUT_0$ and $OUT_1$, with original circuit section 100. First programmable interconnection block 130 allows the connection of either original circuit section 100 or first and second programmable circuit blocks 110 and 120 to output signal lines $OUT_0$ and $OUT_1$.

It should be noted that the number of programmable circuit blocks and programmable interconnection blocks is not limited to those specifically shown in the drawings. The functional capabilities, as well as the number of input and output signal lines, of the original circuit, the programmable circuit blocks, and the programmable interconnection blocks all play a role in determining the number of circuit and interconnection blocks that are used in a particular implementation. Furthermore, no requirement exists that all of the circuit or interconnection blocks be the same; mixing and matching of various designs for each of the two block types may indeed be beneficial, depending on the particular integrated circuit involved.

When the overall circuit of FIG. 2 is initially tested, first programmable interconnection block 130 is configured to connect original circuit section 100 to output signal lines $OUT_0$ and $OUT_1$, while effectively disconnecting first and second programmable circuit blocks 110 and 120 from output signal lines $OUT_0$ and $OUT_1$. Thus, original circuit section 100, if designed correctly, will provide the needed functionality to IC 1. However, if it appears, either through testing of IC 1 or other means, that original circuit section 100 does not provide the necessary functionality, first and second programmable circuit blocks 110 and 120, being connected with the same inputs as original circuit section 100, are then programmed to provide a function that effectively replaces the functionality provided by original circuit section 100. First programmable interconnection block 130 is then configured to connect first and second programmable circuit blocks 110 and 120 with output signal lines $OUT_0$ and $OUT_1$, and also disconnecting original circuit section 100 from those same output signal lines $OUT_0$ and $OUT_1$. As a result, the functionality of original circuit section 100 is updated without the need for permanent modification of the actual hardware on IC 1.

Figure 3:
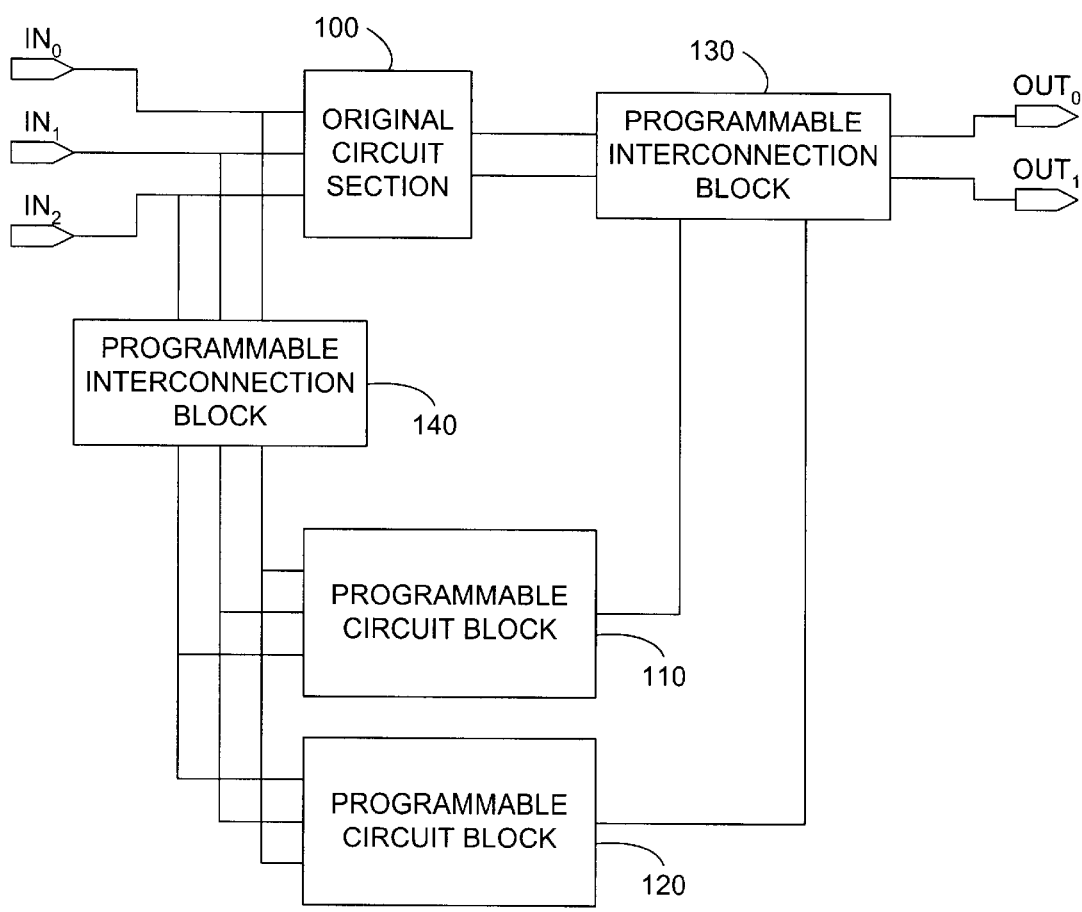
FIG. 3 is a block diagram of an embodiment of the invention that uses a programmable interconnection block to couple programmable circuit blocks with the input signal lines associated with the original circuit section.

A slightly different embodiment of the invention is shown in FIG. 3. In addition to the aspects of the embodiment of FIG. 1, this particular embodiment includes a second programmable interconnection block 140 that couples the input signal lines $IN_0$, $IN_1$, and $IN_2$ with first and second programmable circuit blocks 110 and 120. Second programmable interconnection block 140 allows the input signal lines $IN_0$, $IN_1$, and $IN_2$ to be coupled with one or more different inputs of programmable circuit blocks 110 and 120, thereby allowing more versatility in the functionality that programmable circuit blocks 110 and 120 can provide.

Figure 4:
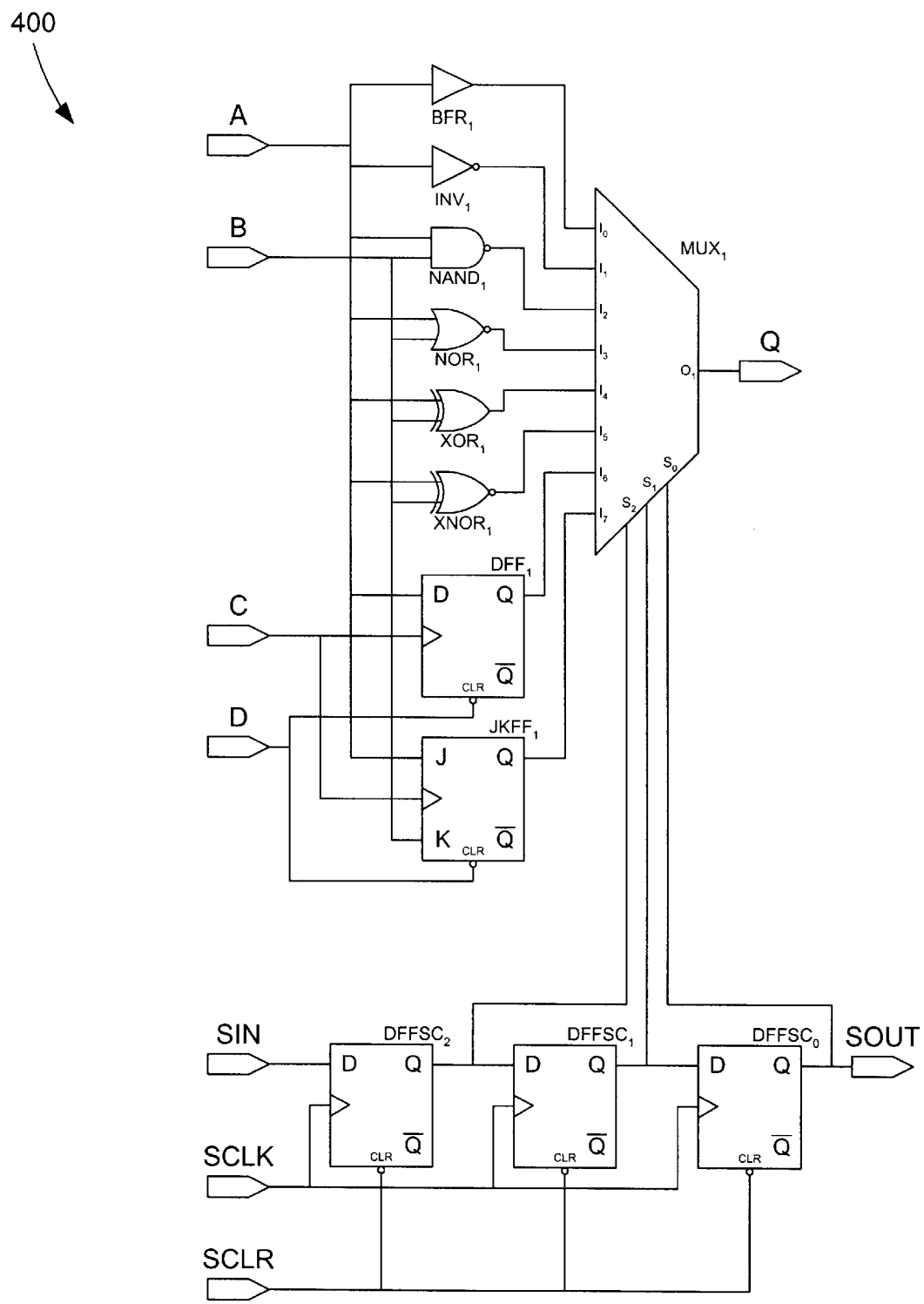
FIG. 4 is a schematic diagram of a programmable logic block to be used as a programmable circuit block according to an embodiment of the invention.

To further describe some embodiments of the invention, FIG. 4 displays one of many possible examples of a programmable circuit block. In this particular case, the programmable circuit block is a programmable logic block 400, which implements various Boolean logic functions that are useful in digital logic circuitry. Programmable logic block 400 has input signal connections A, B, C, and D, any of which may be coupled with the input signal lines of an original circuit within an IC. Input signal connections A, B, C, and D are transformed logically within programmable logic block 400 to produce a signal on output signal connection Q, which is coupled with the output signal lines of the original circuit to perform a function to replace that of the original circuit. As stated earlier, any number of input and output signal connections may be implemented in a typical programmable circuit block; the number of input and output signal connections shown in FIG. 4 are just one specific example.

In the programmable circuit block of FIG. 4, input signal connections A, B, C, and D are connected to two basic types of logic circuitry: combinatorial logic gates and synchronous logic flip-flops. The combinatorial logic gates in this example are a digital buffer $BFR_1$, a logic inverter $INV_1$, a negative-AND gate $NAND_1$, a negative-OR gate $NOR_1$, an exclusive-OR gate $XOR_1$, and a negative exclusive-OR gate $XNOR_1$. Other embodiments contemplated may include, but are not limited to, the use of AND and OR gates, as well as various combinations of gates, such as a level of AND gates, the outputs of which feed the inputs of an OR gate.

In FIG. 4, synchronous logic elements are also used. A 'D' flip-flop, $DFF_1$, and a 'J–K' flip-flop $JKFF_1$, are the logic storage elements employed in this specific embodiment; any combination of other storage elements, such as 'S–R' flip-flops, 'T' flip-flops, transparent latches, and the like, are also possible. The selection of the types of logic gates and flip-flops to be used in programmable logic block 400 may be tailored specifically to the needs of the integrated circuit in which programmable logic block 400 is to be employed.

The selection of which type of logic function is to be placed at output signal connection Q is facilitated by logic multiplexer $MUX_1$, which is a standard 8-to-1 multiplexer well-known in the art. In this embodiment, the outputs of $BFR_1$, $INV_1$, $NAND_1$, $NOR_1$, $XOR_1$, $XNOR_1$, $DFF_1$, and $JKFF_1$, are each tied to multiplexer inputs $I_0$ through $I_7$, respectively. Only one of multiplexer inputs $I_0$ through $I_7$ is passed to output signal connection Q at any one time, with that multiplexer input being selected by the state of multiplexer selector lines $S_2$ through $S_0$. The state of multiplexer selector lines $S_2$ through $S_0$ is determined by the state of three scan chain flip-flops $DFFSC_2$, $DFFSC_1$, and $DFFSC_0$, respectively, which are connected serially to a type of scan chain circuit well-known in the art. Scan chain flip-flops $DFFSC_2$, $DFFSC_1$, and $DFFSC_0$ form part of a larger scan chain implemented throughout the integrated circuit. The scan chain serial input signal SIN is driven by the last scan chain flip-flop preceding $DFFSC_2$ (not shown in FIG. 4), while scan chain serial output signal SOUT drives the input of the next scan chain flip-flop in line (also not shown). All scan-chain flip-flops are clocked by scan chain serial clock signal SCLK, and are cleared by scan chain clear signal SCLR. Scan chain flip-flops $DFFSC_2$ through $DFFSC_0$ are thus programmed as part of an overall scan chain circuit within an IC prior to normal operational use of the IC in order to configure the circuitry correctly.

In the example of FIG. 4, standard flip-flop circuitry is used to configure programmable logic block 400. Other forms of logic memory may also be used to configure programmable logic block 400. For example, FLASH or EEPROM technology may be used with an integrated circuit to set multiplexer selector lines $S_2$ through $S_0$ so that the desired configuration for programmable logic block 400 may be attained, with the added benefit of the configuration being nonvolatile, so that a particular configuration may survive one or more power cycles.

In addition to the embodiments of FIG. 4, many other forms of programmable logic may suffice as an implementation for first and second programmable circuit blocks 110 and 120. As just one example, standard programmable blocks as utilized in the programmable logic devices produced by Xilinx, Inc., would be useful in many IC applications. Also, feedback loops, such as what would be necessary to implement a cross-coupled latch, for example, are possible in other forms of first and second programmable circuit blocks 110 and 120.

Additional alternative embodiments of the present invention involve the use of programmable analog circuitry instead of programmable logic. For example, first and second programmable circuit blocks 110 and 120 of FIG. 2 and FIG. 3 may be programmable analog circuit blocks. A few examples of such blocks are integrated into the "Totally Re-configurable Analog Circuit," or "TRAC," devices developed by Fast Analog Solutions Ltd. Analog functions such as analog voltage adders, inverting voltage amplifiers, analog signal buffers, and the like may be provided in such embodiments in a fashion similar to the NAND and NOR gates of programmable logic block 400 of FIG. 4, with analog switches being used in lieu of a digital multiplexer or similar circuit to select which function is performed. Furthermore, the use of feedback loops in programmable analog circuit blocks provides additional functionality for the IC designer. The programming of the programmable analog blocks would be performed using the same methods as proposed for their logic circuit counterparts.

Figure 5:
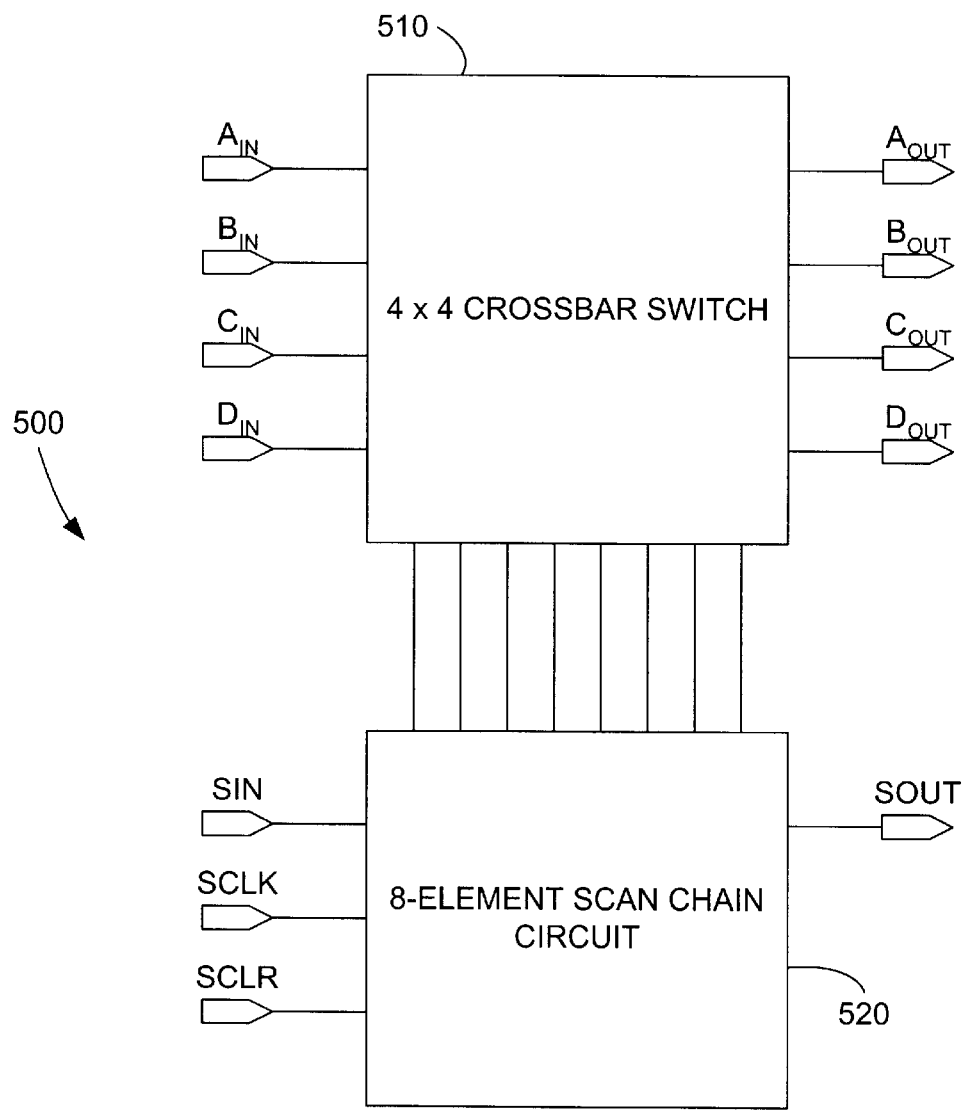
FIG. 5 is a schematic diagram of a crossbar switch to be used as a programmable interconnection block according to an embodiment of the invention.

Similar to the variety of ways in which first and second programmable circuit blocks 110 and 120 may be implemented, programmable interconnection blocks 130 and 140 may be embodied using myriad connection schemes. For example, FIG. 5 shows an embodiment of a programmable interconnection block 500, which has a 4×4 crossbar switch 510, which is typical and well-known in the art. As with a typical crossbar switch, any of switch input connections $A_{IN}$, $B_{IN}$, $C_{IN}$, and $D_{IN}$ can be connected to any of switch output connections $A_{OUT}$, $B_{OUT}$, $C_{OUT}$, and $D_{OUT}$. The internal circuitry of crossbar switch 510 would be designed in accordance with the digital or analog nature of switch input connections $A_{IN}$, $B_{IN}$, $C_{IN}$, and $D_{IN}$, and switch output connections $A_{OUT}$, $B_{OUT}$, $C_{OUT}$, and $D_{OUT}$. Of course, a crossbar switch with any number of inputs and outputs may be devised to accommodate the needs of an original circuit and associated programmable circuit block within an IC. Additionally, the programmability of a crossbar switch may be accommodated by any of the techniques mentioned above, and. equivalents, for programmable circuit blocks. In the embodiment of FIG. 5, an 8-element scan chain circuit 520 having a scan chain serial input signal SIN, a scan chain serial output signal SOUT, a scan chain serial clock signal SCLK, and a scan chain clear signal SCLR, as similarly shown in FIG. 4, is used to configure crossbar switch 510. For a crossbar switch with N inputs and N outputs, a total of $N*\log_2 N$ scan chain flip-flops will normally be necessary to facilitate configuration of the switch, as is known to one of skill in the art. Hence, for crossbar switch 510, a total of $4*\log_2(4)$, or 8, storage elements are needed. The output of each of the 8 storage elements is then used to configure crossbar switch 510. Furthermore, any other configurable switch constructs which allow any connections desired by the IC designer between the original circuit, the programmable circuit blocks, and the other portions of the IC, could be used to implement the programmable interconnection blocks according to embodiments of the present invention.

Figure 6:
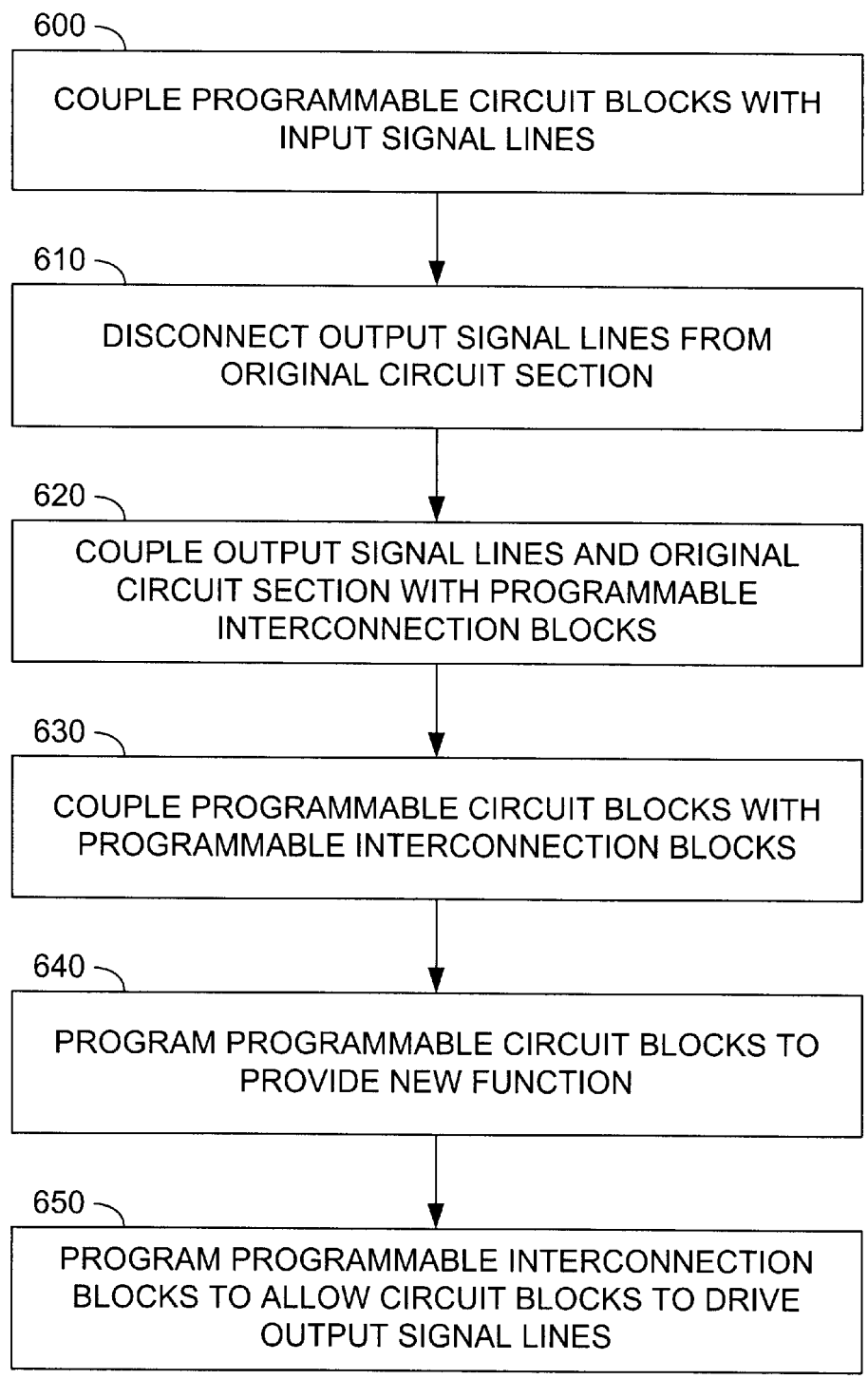
FIG. 6 is a flow chart of a method according to an embodiment of the invention that connects the programmable circuit blocks directly to the input signal lines associated with the original circuit section.

As shown in FIG. 6, the invention may also be embodied as a method of allowing the functionality of an original circuit section within an integrated circuit to be modified dynamically by way of simple programming. First, one or more programmable circuit blocks are coupled with input signal lines associated with the original circuit section during the design of the integrated circuit (step 600). Also during the IC design, output signal lines associated with the original circuit section are disconnected from the original circuit section (step 610), after which both the output signal lines and the original circuit section are coupled to one or more programmable interconnection blocks (step 620). The programmable circuit blocks are then coupled with the programmable interconnection blocks (step 630). Once the IC has been fabricated, and it has been determined that the functionality of the original circuit should be replaced, the programmable circuit blocks are programmed (either in a target system or an appropriate test system) to generate a second circuit function within the integrated circuit that serves as a replacement for the functionality of the original circuit section (step 640). Finally, the programmable interconnection blocks are programmed to couple the programmable circuit blocks with the output signal lines so that programmable circuit blocks drive the output signal lines (step 650). As a result of this last step, the original circuit section is decoupled from the output signal lines, thus replacing the functionality of the original circuit section with that provided by the programmable circuit blocks.

Figure 7:
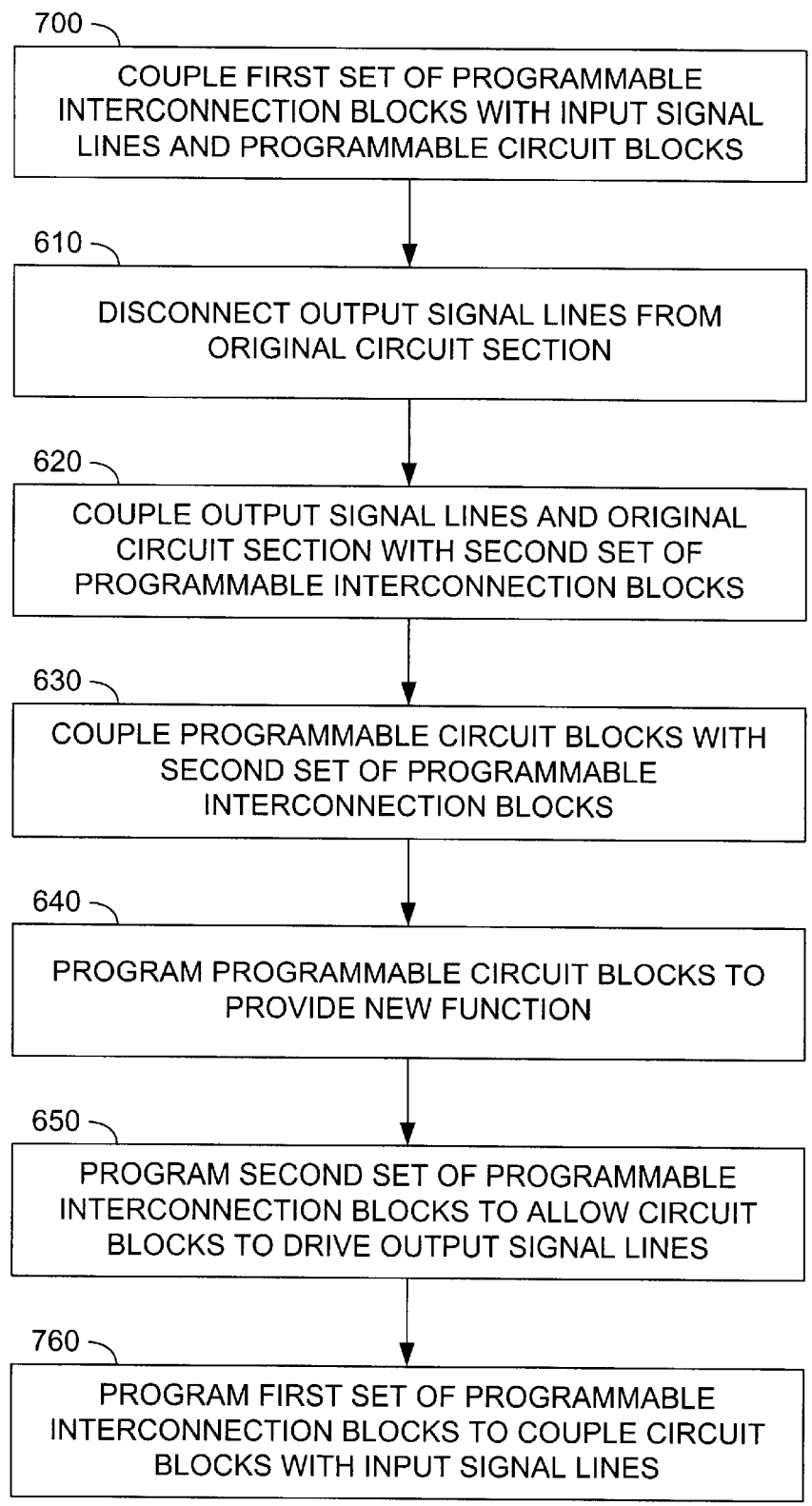
FIG. 7 is a flow chart of a method according to an embodiment of the invention that uses programmable interconnection blocks to couple the programmable circuit blocks with the input signal lines associated with the original circuit section.

In another method embodiment, shown in the flow chart of FIG. 7, most of the steps shown in the embodiment of FIG. 6 are once again utilized. However, instead of coupling the programmable circuit blocks directly with the input signal lines (step 600 of FIG. 6), the programmable circuit blocks are connected to a first set of programmable interconnection blocks which are, in turn, coupled with the input signal lines (step 700), while a second set of programmable interconnection blocks couples the output signal lines with the original circuit section and the programmable circuit blocks (step 620). Also, in addition to the programming steps of FIG. 6, the first set of programmable interconnection blocks are programmed to couple the appropriate input signal lines with the programmable circuit blocks (step 760).

From the foregoing, it will be apparent that the invention provides a simple system and method of allowing dynamic modifications of selected portions of an integrated circuit so that the functionality of those portions of the IC may updated or repaired without the use of a FIB machine or similar tedious method. The embodiments described above are merely brief, specific examples of the present invention. As a result, the invention is not to be limited to the specific forms and arrangement of blocks described and illustrated herein; the invention is limited only by the claims.

What is claimed is:

1. A system for dynamically modifying the functionality of an integrated circuit, the integrated circuit having an original circuit section that performs a first circuit function, the original circuit section being coupled with at least one input signal line and driving at least one output signal line within the integrated circuit, the system comprising:
    means for performing a second circuit function that serves as a replacement for the first circuit function, the performing means being dynamically configurable by way of a scan chain circuit;
    means for coupling the performing means with the at least one input signal line; and
    means for dynamically coupling the performing means with the at least one output signal line so that the performing means drives the at least one output signal line, the dynamically coupling means decoupling the original circuit section from the at least one output signal line.

2. The system of claim 1, wherein the performing means comprises at least one configurable analog circuit block.

3. The system of claim 1, wherein the performing means comprises at least one programmable logic block.

4. The system of claim 3, wherein the at least one programmable logic block comprises at least one combinatorial logic gate.

5. The system of claim 3, wherein the at least one programmable logic block comprises at least one synchronous logic storage element.

6. The system of claim 1, wherein the performing means comprises at least one feedback loop.

7. An integrated circuit incorporating the system of claim 1.

8. The system of claim 1, wherein the coupling means comprises a permanent electrical connection from the at least one input signal line to the performing means.

9. The system of claim 1, wherein the coupling means comprises at least one programmable interconnection block capable of dynamically connecting the at least one input signal line with the performing means.

10. The system of claim 9, wherein the at least one programmable interconnection block is dynamically configurable by way of a scan chain circuit.

11. The system of claim 1, wherein the dynamically coupling means comprises at least one programmable interconnection block.

12. The system of claim 11, wherein the at least one programmable interconnection block is dynamically configurable by way of a scan chain circuit.

13. A system for dynamically modifying the functionality of an integrated circuit, the integrated circuit having an original circuit section that performs a first circuit function, the original circuit section being coupled with at least one input signal line and driving at least one output signal line within the integrated circuit, the system comprising:
    at least one programmable circuit block capable of performing a second circuit function that serves as a replacement for the first circuit function, the at least one programmable circuit block being coupled with the at least one input signal line, the at least one programmable circuit block being dynamically configurable by way of a scan chain circuit; and
    at least one first programmable interconnection block that dynamically couples the at least one programmable circuit block with the at least one output signal line so that the at least one programmable circuit block drives the at least one output signal line, the at least one first programmable interconnection block decoupling the original circuit section from the at least one output signal line.

14. The system of claim 13, wherein the at least one programmable circuit block has a permanent electrical connection with the at least one input signal line.

15. The system of claim 13, further comprising at least one second programmable interconnection block that couples the at least one programmable circuit block with the at least one input signal line.

16. The system of claim 15, wherein the at least one second programmable interconnection block is dynamically configurable by way of a scan chain circuit.

17. The system of claim 13, wherein the at least one programmable circuit block comprises at least one configurable analog circuit block.

18. The system of claim 13, wherein the at least one programmable circuit block comprises at least one programmable logic block.

19. The system of claim 18, wherein the at least one programmable logic block comprises at least one combinatorial logic gate.

20. The system of claim 18, wherein the at least one programmable logic block comprises at least one synchronous logic storage element.

21. The system of claim 13, wherein the at least one programmable circuit block comprises at least one feedback loop.

22. An integrated circuit incorporating the system of claim 13.

23. The system of claim 13, wherein the at least one first programmable interconnection block is dynamically configurable by way of a scan chain circuit.

24. A method of dynamically modifying the functionality of an integrated circuit, the integrated circuit having an original circuit section that performs a first circuit function, the original circuit section being coupled with at least one input signal line and driving at least one output signal line within the integrated circuit, the method comprising:

coupling at least one programmable circuit block with the at least one input signal line;

decoupling the output signal lines from the original circuit section;

coupling at least one programmable interconnection block with the original circuit section and the at least one output signal line;

coupling the at least one programmable circuit block with the at least one programmable interconnection block;

programming the at least one programmable circuit block by way of a scan chain circuit to generate a second circuit function within the integrated circuit that serves as a replacement for the first circuit function; and programming the at least one programmable interconnection block to couple the at least one programmable circuit block with the at least one output signal line, so that the at least one programmable circuit block drives the at least one output signal line, the at least one programmable interconnection block decoupling the original circuit section from the at least one output signal line.

25. An integrated circuit which has been modified using the method of claim 24.

26. A method of dynamically modifying the functionality of an integrated circuit, the integrated circuit having an original circuit section that performs a first circuit function, the original circuit section being coupled with at least one input signal line and driving at least one output signal line within the integrated circuit, the method comprising:

coupling at least one first programmable interconnection block with at least one programmable circuit block and the at least one input signal line;

decoupling the output signal lines from the original circuit section;

coupling at least one second programmable interconnection block with the original circuit section and the at least one output signal line;

coupling the at least one programmable circuit block with the at least one second programmable interconnection block;

programming the at least one programmable circuit block by way of a scan chain circuit to generate a second circuit function within the integrated circuit that serves as a replacement for the first circuit function;

programming the at least one first programmable interconnection block to couple the at least one programmable circuit block with the at least one input signal line; and programming the at least one second programmable interconnection block to couple the at least one programmable circuit block with the at least one output signal line, so that the at least one programmable circuit block drives the at least one output signal line, the at least one second programmable interconnection block decoupling the original circuit section from the at least one output signal line.

27. An integrated circuit which has been modified using the method of claim 26.

* * * * *